United States Patent [19]
Fowler et al.

[11] Patent Number: 5,461,425
[45] Date of Patent: Oct. 24, 1995

[54] CMOS IMAGE SENSOR WITH PIXEL LEVEL A/D CONVERSION

[75] Inventors: Boyd Fowler, Santa Clara; Abbas El Gamal, Palo Alto, both of Calif.

[73] Assignee: Stanford University, Palo Alto, Calif.

[21] Appl. No.: 196,686

[22] Filed: Feb. 15, 1994

[51] Int. Cl.⁶ .............................. H04N 3/14; H04N 5/335
[52] U.S. Cl. ......................... 348/294; 348/297; 348/311; 210/208.1
[58] Field of Search .................................... 348/222, 227, 348/230, 236, 294, 304, 311, 312, 297, 298; 257/291, 292; 250/208.1, 200.1; H04N 3/14, 5/335

[56] References Cited

U.S. PATENT DOCUMENTS

| | | | |
|---|---|---|---|
| 5,012,344 | 4/1991 | Goto | 348/297 |
| 5,329,109 | 7/1994 | Kodama | 348/230 |

FOREIGN PATENT DOCUMENTS

| | | | |
|---|---|---|---|
| 0204977 | 4/1988 | Japan | H04N 5/335 |

OTHER PUBLICATIONS

David E. Ludwig et al., "On–Focal Plane Analog–to–Digital Conversion with Detector Gain and Offset Compensation," SPIE vol. 1097 Materials, Devices, Techniques, and Applications for Z–Plane Focal Plane Array (FPA) Technology (1989), pp. 73–83.

Robert Forchheimer et al., "MAPP2200–A second generation smart optical sensor," a Product Description for Integrated Vision Products AB.

Christopher B. Umminger et al., "Switched Capacitor Networks for Focal Plane Image Processing Systems," IEEE Transactions on Circuits and System for Video Technology, vol. 2, No. 4, Dec. 1992, pp. 392–400.

William Mandl et al., "All Digital Monolithic Scanning Readout Based On Sigma–Delta Analog To Digital Conversion," SPIE vol. 1684 Infrared Readout Electronics (1992), pp. 239–246.

James C. Candy, "A Use of Double Integration in Sigma Delta Modulation," IEEE Transactions On Communications, vol. COM–33, No. 3, Mar. 1985, pp. 249–258.

P. B. Denyer et al., "CMOS Image Sensors for Multimedia Applications," IEEE 1993 Custom Integrated Circuits Conference, pp. 11.5.1–11.5.4.

Robert Forchheimer et al., "A Single Chip Linear Array Picture Processor," Proceedings of SPIE–The International Society for Optical Engineering, vol. 397, Apr. 19–22, 1983, pp. 425–429.

Craig L. Keast et al., "A CCD/CMOS–Based Imager with Integrated Focal Plane Signal Processing," IEEE Journal of Solid–State Circuits, vol. 28, No. 4, Apr. 1993, pp. 431–437.

T. M. Buch et al., "Influence of Bulk and Surface Properties on Image Sensing Silicon Diode Arrays," The Bell System Technical Journal, vol. 47, Nov. 1968, No. 9, pp. 1827–1854.

*Primary Examiner*—James J. Groody
*Assistant Examiner*—Glenton B. Burgess
*Attorney, Agent, or Firm*—Skjerven, Morrill, MacPherson, Franklin & Friel; Brian D. Ogonowsky

[57] ABSTRACT

An image sensor formed using a CMOS process is described herein which includes a pixel array core of phototransistors whose conductivities are related to the magnitude of light impinging upon the phototransistors. The analog signals generated by the phototransistors are converted to a serial bit stream by an A/D converter connected at the output of each phototransistor and formed in the immediate area of each phototransistor within the array core. Thus, a separate digital stream for each pixel element is output from the array core, and parasitic effects and distortion are minimized. In one embodiment, a filter circuit is connected to an output of the array core for converting the individual digital streams from each pixel element to multi-bit values corresponding to the intensity of light impinging on the phototransistor.

18 Claims, 4 Drawing Sheets

CMOS IMAGE SENSOR WITH PIXEL LEVEL A/D CONVERSION

FIELD OF THE INVENTION

This invention relates to image sensors for converting an optical image into electrical signals.

BACKGROUND OF THE INVENTION

An image sensor is used to convert an optical image focused on the sensor into electrical signals. The image sensor typically includes an array of light detecting elements, where each element produces a signal corresponding to the intensity of light impinging on that element when an image is focused on the array. These signals may then be used, for example, to display a corresponding image on a monitor or otherwise used to provide information about the optical image.

One very common type of image sensor is a charge coupled device (CCD). Integrated circuit chips containing a CCD image sensor have a relatively low yield and are expensive due to the specialized processing involved. The CCDs also consume a relatively large amount of power. Other well known disadvantages exist.

A much less expensive type of image sensor is formed as an integrated circuit using a CMOS process. In such a CMOS type image sensor, a photodiode or phototransistor (or other suitable device) is used as the light detecting element, where the conductivity of the element corresponds to the intensity of light impinging on the element. The variable signal thus generated by the light detecting element is an analog signal whose magnitude is approximately proportional (within a certain range) to the amount of light impinging on the element.

It is known to form these light detecting elements in a two dimensional core array which is addressable by row and column. Once a row of elements has been addressed, the analog signals from each of the light detecting elements in the row are coupled to the respective columns in the array. An analog-to-digital (A/D) converter may then be used to convert the analog signals on the columns to digital signals so as to provide only digital signals at the output of the image sensor chip.

It has also been discovered by the Applicants that, for large area pixel arrays, the analog signals generated by each light detecting element are subject to varying degrees of parasitic effects such as those caused by parasitic capacitances, inductances, and resistances. These parasitic effects are difficult to control and result in degradation of the signal-to-noise ratio of the image information.

Other undesirable features of these prior art image sensors include high complexity, severe timing restrictions, and high power dissipation.

What is needed is an inexpensive, but highly efficient, two dimensional image sensor which produces more reliable images.

SUMMARY

An image sensor formed using a CMOS process is described herein which includes a two-dimensional pixel array core of phototransistors whose conductivities are related to the magnitude of light impinging upon the phototransistors. The analog signals generated by the phototransistors are converted to a digital signal by an A/D converter connected at the output of each phototransistor and formed in the immediate area of each phototransistor within the array core. A special A/D converter using only 22 MOS transistors helps enable this configuration. A preferred A/D converter generates a serial stream of bits, which can be eventually filtered outside of the array core to determine the relative light intensity impinging on the associated phototransistor. Such an A/D converter may be a one-bit, first order Sigma-Delta modulator. Thus, a separate digital stream for each pixel element is output from the array core, and parasitic effects and distortion are minimized.

All pixel elements are clocked simultaneously and provide digital signals substantially over the entire image frame period. Thus, the bit stream output by each pixel element for one frame period may be long, and a high resolution is obtained.

In one embodiment, an on-chip filter circuit is connected to the output of the array core for converting the individual digital streams from each pixel element to, for example, eight-bit values corresponding to the intensity of light impinging on the phototransistor. In another embodiment, the serial bit stream output for each pixel element is transmitted off-chip for filtering at a remote location. Other novel features of the image sensor are also described. The image sensor is particularly suitable for use in low power and low cost systems such as telephones and surveillance cameras.

DETAILED DESCRIPTION OF THE PREFERRED EMBODIMENTS

Figure 1:
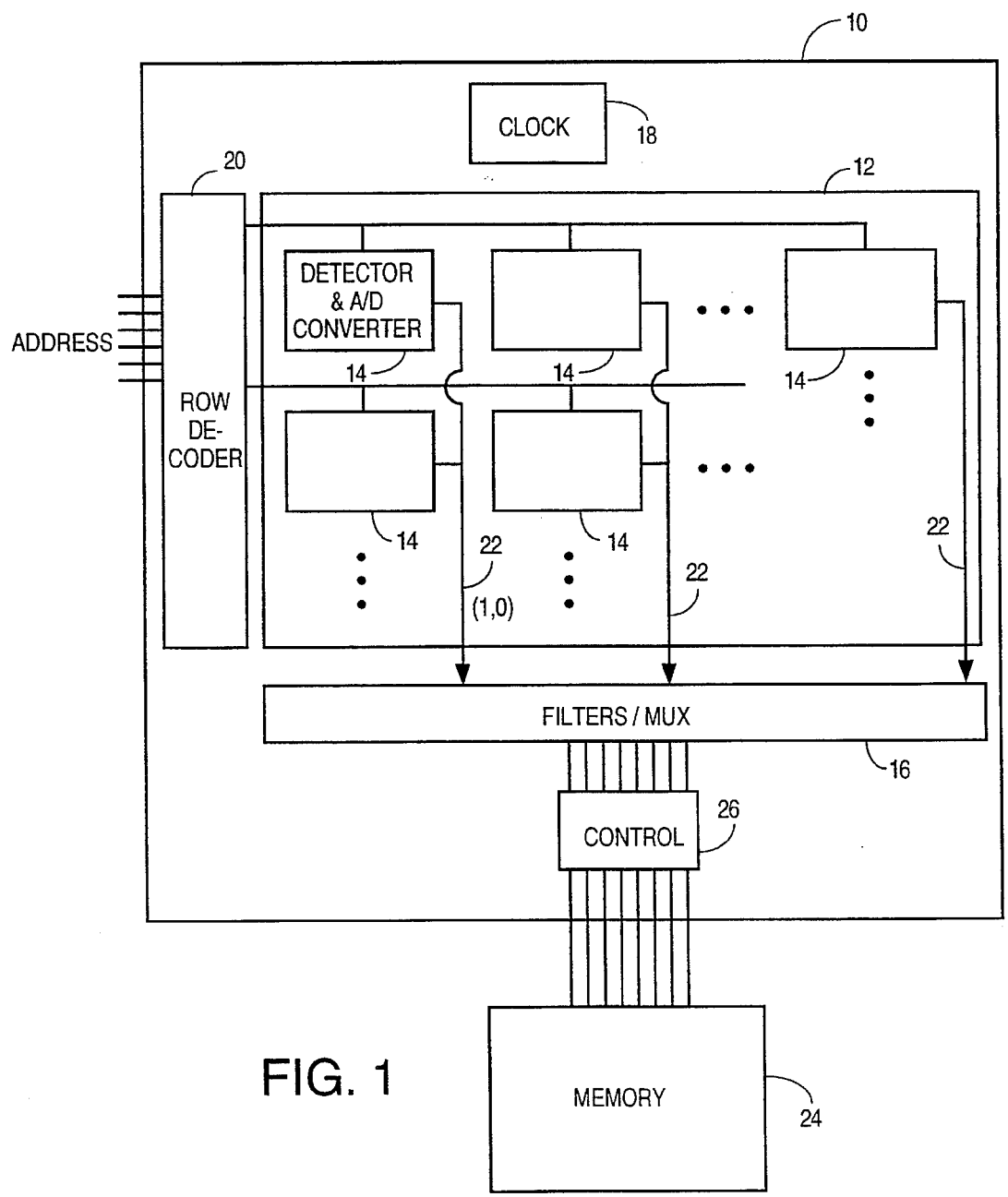
FIG. 1 is a block diagram of a chip containing a pixel array core having a dedicated A/D converter in the core for each light detector element.

FIG. 1 illustrates the general principles of the preferred embodiment. The image sensor of FIG. 1 is formed on a single integrated circuit chip 10.

Figure 2:
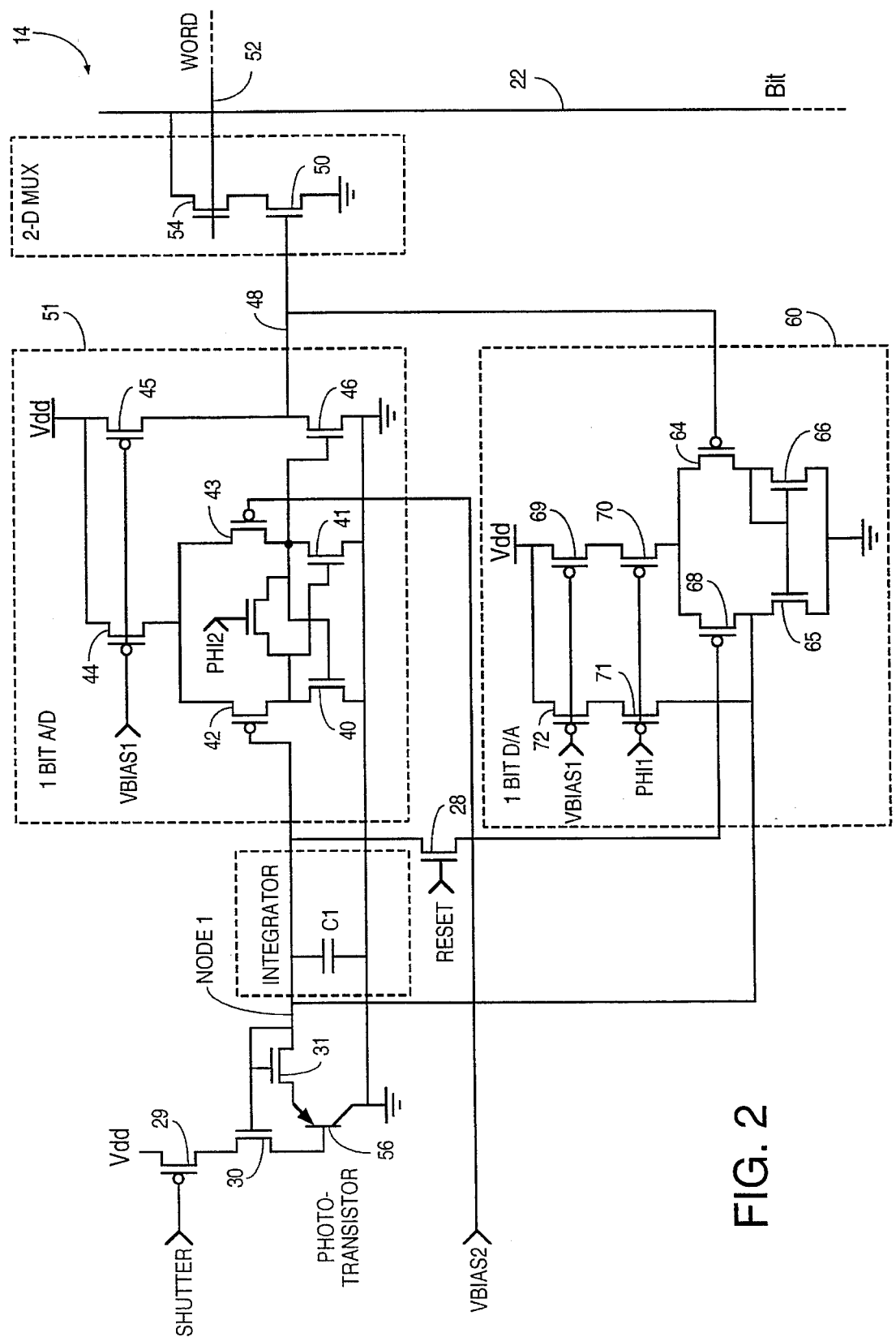
FIG. 2 is a schematic diagram of a preferred pixel element comprising a phototransistor and an A/D converter connected directly to the output of the phototransistor.

Image sensor core 12 comprises a two-dimensional array of light detecting elements, each connected to a dedicated A/D converter which outputs a stream of bits representative of the analog output of the light detecting element. The combination of a light detecting element and A/D converter constitutes a single pixel element 14 in FIG. 1. Each pixel element 14 includes identical circuitry, which is shown in FIG. 2.

In one embodiment, digital filters 16 on chip 10 are connected to receive the digital streams from each pixel element 14 and convert each digital stream to an eight-bit byte representative of one of 256 levels of light intensity detected by the respective pixel element 14.

In an alternative embodiment, the filtering to convert the digital streams output from the core 12 to eight-bit values is performed by hardware off-chip or by software using an external microprocessor. Such off-chip filtering may be preferable if the image signals are to be transmitted over telephone lines or by radio waves. In such a case, the original digital stream (or a compressed digital stream) generated by each pixel element 14 would be transmitted and the filtering performed at the receiving end.

In operation, an image is focused on the image sensor core 12 such that a different portion of the focused image impinges on each pixel element 14. In the preferred embodiment, each light detecting element comprises a phototransistor whose conductivity is related to the intensity of light impinging upon the base of the phototransistor. The analog current through the phototransistor will thus correspond to the intensity of light impinging upon the phototransistor. The analog signals from all phototransistors in the core 12 are simultaneously converted into serial bit streams output from dedicated A/D converters clocked using a common clock driver 18. The serial bit streams, over a period of time (i.e., over a frame period), can then be processed by filters 16 (on-chip or off-chip) to derive a signal representative of the intensity of light impinging on the phototransistor.

After each clock cycle, one bit is latched at an output of each A/D converter within each pixel element 14. To now transfer each bit generated by the pixel elements 14 to the filters 16 after each clock cycle, each of the rows of pixel elements 14 are addressed in sequence, using row decoder 20, until all rows of pixel elements 14 have been addressed. Upon addressing each row, the one-bit output of each pixel element 14 in the addressed row is coupled to a corresponding bit line 22. In one embodiment, there are 64 rows of pixel elements 14 and 64 pixel elements 14 in a row, for a total of 4096 pixel elements 14 in core 12. Thus, in this single clock cycle and row addressing sequence, a complete 64×64 array of bits (referred to as a bit plane) has been output to filters 16 for processing. At the end of a frame period of, for example, 20 A/D converter clock cycles, 20 complete bit planes have been output from the array core 12 to the filters 16.

The filters 16 process the 20-bit stream from each pixel element 14 to generate an eight-bit value per pixel element 14 corresponding to the average intensity of light impinging on the respective pixel element 14 for that frame period. These eight-bit values may then be output from the chip 10, using a suitable multiplexer or shift register, and temporarily stored in a bit-mapped memory 24. The memory 24 may then act as a frame buffer, where the 4096 light intensity values in memory 24 are sequentially addressed for controlling the light output of corresponding pixels in a monitor.

In the particular embodiment of FIG. 1, let us assume 64 separate filters 16 are used for converting the bit streams output on the 64 bit lines 22 to eight-bit values. (A multiplexer at the output of the core 12 may reduce the number of required filters to, for example, 16.) The preferred interaction of filters 16 with memory 24 is as follows. Immediately after a row of pixel elements 14 has been addressed, a control circuit 26, using the address generated by row decoder 20, fetches a previous (or interim) eight-bit value stored in memory 24 for each pixel element 14 in the addressed row and loads this previous value into the proper one of the 64 filters 16 about to receive a new bit from that pixel element 14. Conventional memory addressing techniques and circuitry may be used for this process. The single bit output of the respective A/D converters in the addressed pixel elements 14 is then applied to a respective one of the 64 filters 16 containing the previous eight-bit value for that pixel element 14. Each filter 16 then updates the previous eight-bit value with the new single bit of information to generate a new interim value. The now updated eight-bit value generated by each filter 16 is then transferred back into memory 24, under control of the control circuit 26.

Figure 4:
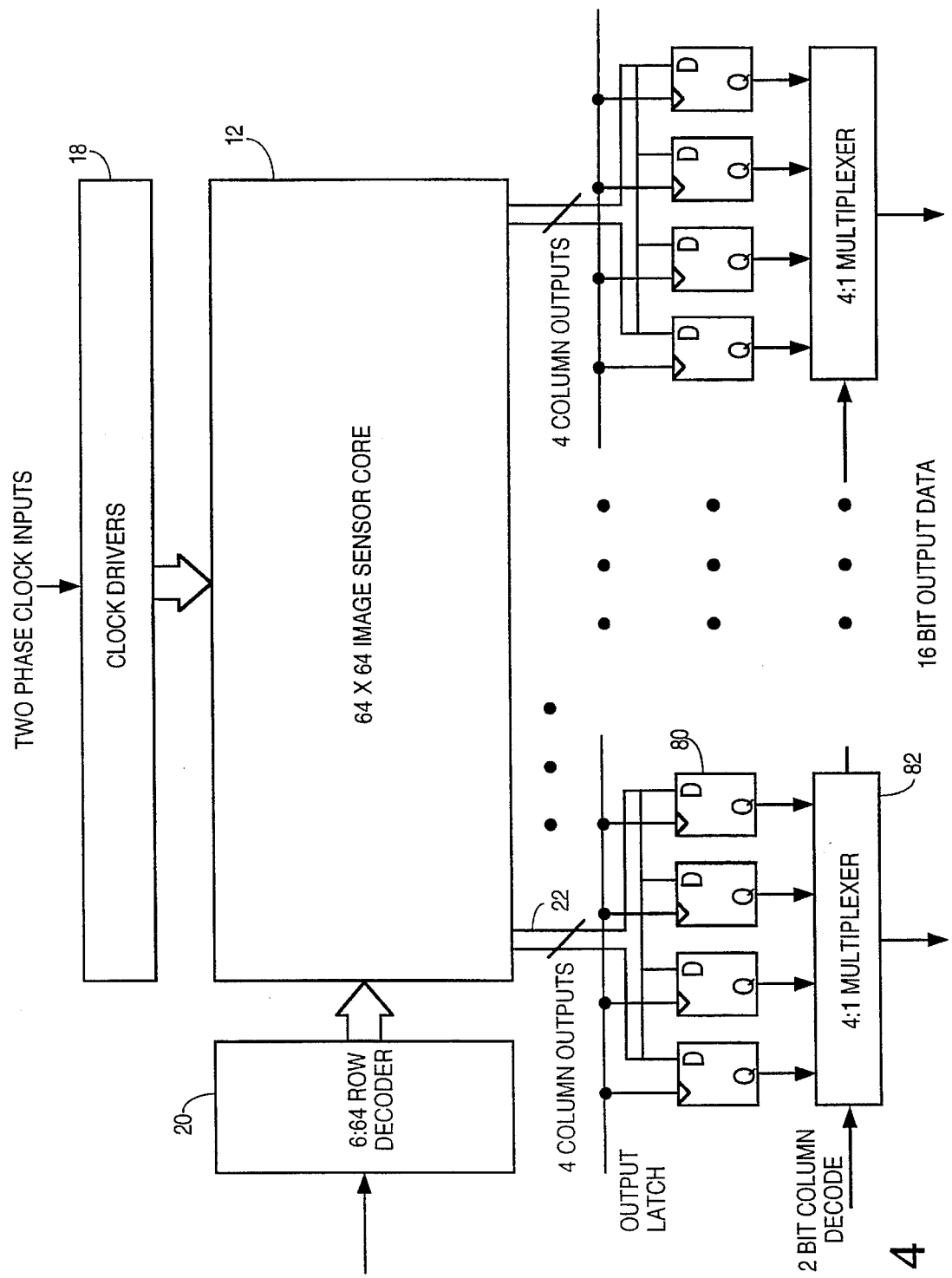
FIG. 4 is a block diagram of an actual embodiment of the image sensor and sense amplifier configuration.

When the next row is then addressed, the same 64 filters now update a different set of eight-bit values stored in memory 24. In this manner, one filter 16 per bit line 22 in array core 12 is needed as opposed to 4096 filters, one per pixel element 16. FIG. 4 illustrates the use of a 4:1 multiplexer 82 to reduce the number of filters needed to sixteen.

After a frame period, the 4096 eight-bit values in memory 24 now represent a single frame of the image sensed by the array core 12. These values may then be read out of memory 24 for display or for further processing. The pixel elements 14 are then reset to an initial state in order to begin outputting a new string of bits representing a next image frame.

Since only digital signals are output from each pixel element 14, parasitic capacitances on bit lines 22, and other parasitic effects, have no influence on the light intensity values ultimately stored in memory 24. This is in contrast to the prior art systems where analog levels are transferred on output lines of an array core, and an A/D converter is provided external to the array core either on-chip of off-chip.

Additionally, since the values stored in memory 24 reflect the average light intensity impinging on a pixel element 14 over an entire frame period, a high signal-to-noise ratio of the image information is obtained.

FIG. 2 is a circuit schematic of each pixel element 14.

Each of the pixel elements 14 are clocked by clock driver 18 (FIG. 1) using the same nonoverlapping clock signals PHI1 and PHI2. The operation of the single pixel element 14 in FIG. 2 described below occurs simultaneously with the operation of all the pixel elements 14 in the array core 12.

In a first step of the operation of the circuit of FIG. 2, conductive bit line 22 is precharged to a logical high voltage, using conventional methods typically used to precharge bit lines in memory arrays. Bias voltages $V_{bias1}$ and $V_{bias2}$ are continuously applied. $V_{bias1}$ is set close to the supply voltage $V_{dd}$ to minimize power consumption.

A reset signal is applied to the gate of NMOS transistor 28 to turn transistor 28 on so as to temporarily connect node 1 of the circuit to $V_{bias2}$. The reset signal is then removed. At this point, the circuit is initialized with capacitor C1 and bit line 22 charged to an initial level.

The shutter signal applied to PMOS transistor 29 has a duty cycle set to maximize the image signal-to-noise ratio (SNR) without saturating the data conversion circuitry. When PMOS transistor 29 is on, the PNP phototransistor 56 is turned off. NMOS transistors 30 and 31 are connected as current mirrors and act to limit the pull-up voltage applied to the base of phototransistor 56 when PMOS transistor 29 is on.

Clock pulses PHI1 and PHI2 are the phases of a two-phase nonoverlapping clock. Clock signal PHI2, when high, controls the latch comprising NMOS transistors 40 and 41 to freeze for a clock period the state of the differential amplifier comprising PMOS transistors 42 and 43. Transistors 44 and 45 have a constant gate voltage $V_{bias1}$ applied to them and act as current sources for the differential amplifier and output stage, respectively. The gate of PMOS transistor 42 is coupled to node 1, while the gate of transistor 43 is coupled to voltage $V_{bias2}$. Hence, if node 1 is greater than $V_{bias2}$ at the time when PHI2 goes low, transistor 43 will turn on while transistor 42 will turn off. The latch comprising transistors 40 and 41 will freeze this state for one clock period.

The output of the latch is coupled to the gate of NMOS transistor 46. In the present example, since node 1 is assumed to be higher than $V_{bias2}$ and transistor 43 is on, a high voltage will be coupled to the gate of NMOS transistor 46 to turn on transistor 46. This will pull output line 48 low to turn off NMOS transistor 50.

As seen, the circuitry identified within block 51 acts as an A/D converter thresholded at $V_{bias2}$.

Shortly after this the PHI2 signal, a high row address signal on word line 52 is coupled to the gate of NMOS transistor 54 to read the state of the A/D converter 51. Since transistor 50 is off, the bit line 22 will not be discharged to ground and thus will remain at a high level. An opposite result occurs when the capacitor C1 voltage at node 1 is less than $V_{bias2}$.

During this time, light is impinging upon phototransistor 56 and thus controlling the conductivity of phototransistor 56. Hence, capacitor C1 (acting as an integrator) will be discharged through phototransistor 56 at a rate depending upon the magnitude of light incident upon phototransistor 56 (and depending upon the duty cycle of shutter transistor 29).

A feedback circuit 60 is connected between line 48 and node 1 to recharge capacitor C1 a fixed amount during the time that PHI1 is low but only after the A/D converter 51 detects that the capacitor C1 voltage at node 1 is less than $V_{bias2}$. This fixed amount is determined by the magnitude of $V_{bias1}$ and the time that clock signal PHI1 is low during each PHI2 clock cycle.

Figure 3A:
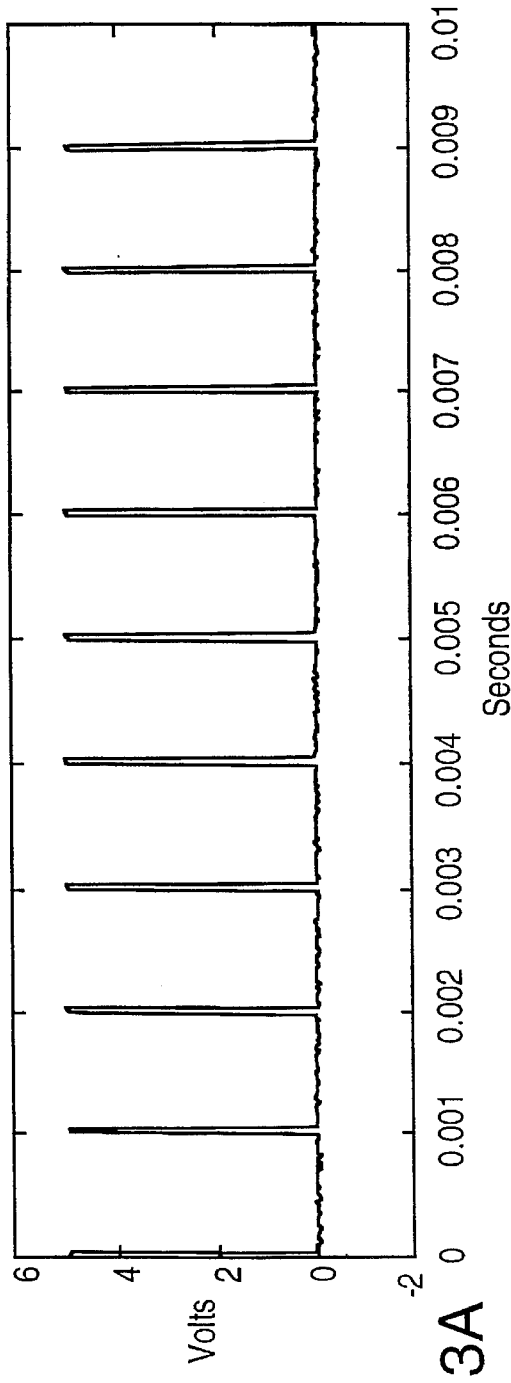
FIGS. 3A and 3B illustrate the clocking of the A/D converter in FIG. 2 and the output of the pixel element.

FIG. 3A illustrates the PHI2 pulse being generated every 0.001 seconds to latch the instantaneous state of the differential amplifier within the A/D converter 51 for the remainder of the clock cycle. The clock signal PHI1 is driven low for a time between each of the PHI2 clock pulses.

The feedback circuit 60 operates as follows. The A/D converter 51 output voltage on line 48 is applied to the gate of PMOS transistor 64. In the previous example, when node 1 exceeded $V_{bias2}$, the voltage level on line 48 was low and the bit line 22 remained at a high state. The low voltage on line 48 causes PMOS transistor 64 to turn on and thus causes NMOS transistors 65 and 66 (connected as current mirrors) to also be on, since the drain of transistor 64 is connected to the gates of transistors 65 and 66. The gate of PMOS transistor 68 is connected to $V_{bias2}$, and transistor 68 is connected to transistor 64 as a differential pair. The current supplied by PMOS transistors 69 and 70 through NMOS transistor 66 is mirrored by NMOS transistor 65. This current through transistor 65 is supplied by transistors 71 and 72. All current provided by transistors 71 and 72 is, thus, shunted to ground through transistor 65, and the feedback circuit 60 neither discharges nor charges capacitor C1 during the time when PHI1 is low. Hence, capacitor C1 will continue discharging through phototransistor 56 at a rate depending upon the intensity of light impinging upon phototransistor 56.

At the point where the voltage on node 1 becomes less than $V_{bias2}$ and clock signal PHI2 is pulsed, the state of line 48 will change from low to high, causing NMOS transistor 50 to be turned on. During this cycle, when word line 52 is now energized to turn on transistor 54, the charged bit line 22 will now discharge through transistors 50 and 54 so that a zero bit is output from the pixel element 14.

The high state on line 48 will cause transistor 64 within the feedback circuit 60 to be off, and thus both transistors 65 and 66 will also be off. When clock signal PHI1 now goes low, current will flow through PMOS transistors 71 and 72 and charge capacitor C1 during the period when PHI1 is low. Thus, depending upon the previous analog level of node 1, the increased voltage across capacitor C1 due to its charging by feedback circuit 60 may be higher than $V_{bias2}$ or may still be lower than $V_{bias2}$. A more quickly discharging capacitor C1, due to a high intensity of light impinging upon phototransistor 56, will cause node 1 to be lower than the threshold voltage $V_{bias2}$ a majority of the time over multiple cycles of PHI2. If the light impinging upon phototransistor 56 is of a low intensity, then only a small current will be discharged through phototransistor 56, and node 1 will be higher than the threshold voltage $V_{bias2}$ a majority of the time over multiple cycles of PHI2. Thus, the average of the binary outputs on bit line 22 over multiple cycles of PHI2 corresponds to the average analog input over that period. Filters 16 include a suitable low pass digital filter and well known processing circuitry for averaging out the stream of ones and zeros output by each pixel element 14 between reset signals and converting this average into a multi-bit value, such as an eight-bit value assuming 256 gray scale levels are to be distinguished.

The more binary outputs of each pixel element 14 read before a next reset signal, the better the SNR of the resulting eight-bit value representative of the light intensity level, since a greater number of samples are averaged together.

Figure 3B:
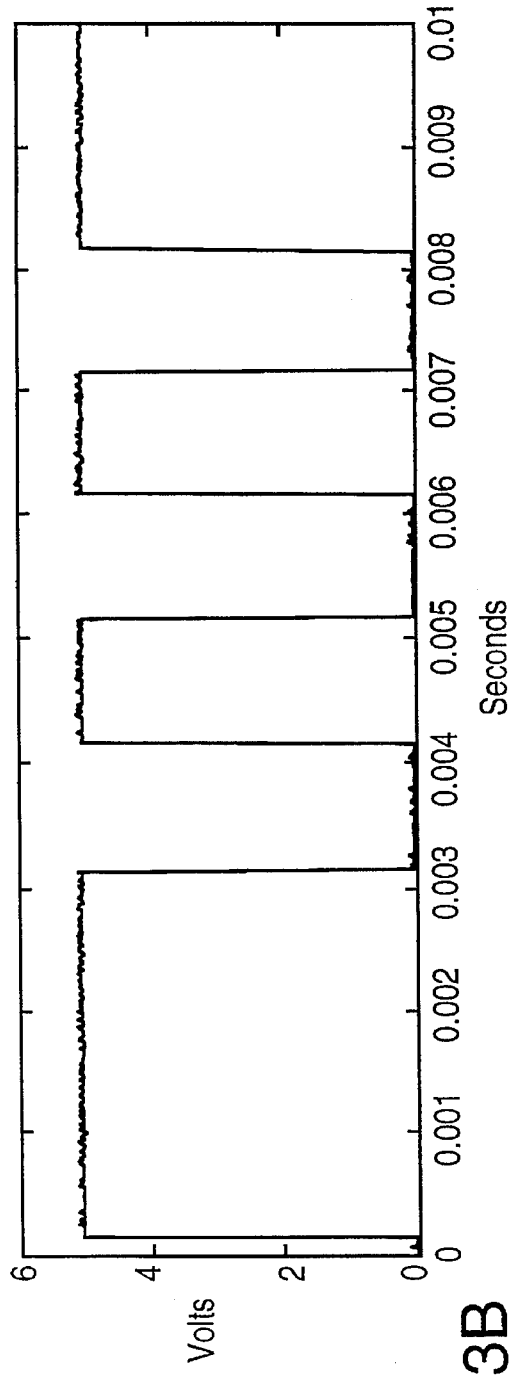

FIG. 3B is an example of a bit stream output by a bit line 22 for a pixel element 14 given a certain intensity of light impinging upon phototransistor 56. In FIG. 3B, when the bit line 22 is at a high state (e.g., after times 0, 0.001, and 0.002), the voltage on node 1 exceeded $V_{bias2}$ at the time of the PHI2 pulse. At those times when the bit line 22 is at a low state (e.g., after times 0.003, 0.005, and 0.007), the voltage at node 1 was less than $V_{bias2}$ at the time of the PHI2 pulse.

The technique used to convert the analog signal output from the phototransistor 56 to a string of bits (shown in FIG. 3B) whose average roughly equals the average of the analog signal is generally known as Sigma-Delta modulation. A number of Sigma-Delta modulation and filtering techniques are described by J. C. Candy in the article "A Use of Double Integration in Sigma-Delta Modulation," IEEE Trans. Comm., 33(3) pages 249–258, March 1985, and described by W. Mandl et al. in the article "All Digital Monolithic Scanning Readout Based on Sigma-Delta Analog to Digital Conversion," SPIE Vol. 1684, pages 239–246, Infrared Readout Electronics 1992, both articles being incorporated herein by reference.

The analog image data immediately converted into digital form by pixel element 14 by using Sigma-Delta modulation facilitates low power and high precision data conversion. The use of Sigma-Delta modulation also allows the data conversion circuitry to be simple and insensitive to process variations. The fact that information is communicated out of the array core 12 in digital form eliminates a need for external A/D conversion and limits potential SNR degradation of any analog signals. In an actual embodiment of an image sensor in accordance with this invention, the filter 16 is implemented in software and is described in the above-named article by J. C. Candy. This filter could also be easily converted to hardware with the addition of simple digital circuitry to the chip's periphery and by using an external memory 24.

In a preferred embodiment, phototransistor 56 is a vertical bipolar PNP transistor. The emitter is formed using source-drain P+ diffusion, the base is an N-well surrounding the emitter, and the collector is a P-substrate. The N-well is exposed to light, while the rest of the circuitry is covered with a second layer of metal to reduce the chance of photon induced latch-up. The physical construction and operation of such bipolar phototransistors are described in the article "A Novel Bipolar Imaging Device With Self-Noise Reduction Capability, . . . " by N Tanaka et al., IEEE Trans. Elec. Dev., 36(1), pages 31–38, January 1989, and the article "A Sensitive Electronic Photoreceptor," by C. Mead, 1985 Chapel Hill Conference on VLSI, Chapel Hill, N.C. 1985, both articles incorporated herein by reference.

The number of bit planes to be output from each pixel element 14 per image frame to derive a single eight-bit digital value representative of a certain gray scale level is determined by the target SNR. The number of bit planes L needed to obtain a selected SNR is given by, $$SNR = (9 \log_2 L - 5.2) \text{dB} \qquad \text{Eq. (1)}$$

For example, to achieve an SNR of approximately 22, eight bit planes would be needed.

The A/D circuit 51 and feedback circuit 60 are clocked at a rate well above the image frame rate (e.g., 30 Hz), which is the Nyquist sampled data rate. The maximum SNR which has been measured so far has been 61 dB, requiring over 163 bit planes per frame.

The resulting image sensor can achieve a dynamic range potentially greater than 93 dB, given an SNR of approximately 33 dB and a dynamic range of the photocurrent of approximately 60 dB.

The sensor's estimated total power of less than 1 mW is significantly lower than that of other types of sensors given the same resolution and SNR. The static current of each pixel element 14 is approximately 10 nA, and a dynamic current for the entire chip, assuming a maximum clock frequency of 256 KHz, is less than 100 μA.

FIG. 4 is a block diagram illustrating one implementation of the chip 10 of FIG. 1. In this embodiment, the 64 bit lines 22 of the array core 12 are connected to inputs of 64 sense amplifiers which, in this particular embodiment, are D latches 80. Thus, for each row addressed, the 64 sense amplifiers 80 will be set depending upon the levels of the bit lines 22.

Since a 16-bit bus is used in the embodiment of FIG. 4, 4:1 multiplexers 82 are used to couple 16 bits at a time from the sense amplifiers 80 to the bus. After four cycles of the multiplexers 82, all 64 bits have now been transferred via the bus to the appropriate filters. Shift registers may also be used to transfer data from the sense amplifiers 80 to the filters. In this implementation, the filters are external to the chip 10.

In one embodiment, data compression circuitry is also implemented on the chip 10 to reduce the bandwidth of data transferred from the chip 10 to external filters. It is desirable that such data compression of the digital signals be performed at the pixel element 14 locations to simplify the data compression circuitry. For example, a previous bit value generated by a pixel element 14 may be temporarily stored in a register at the pixel location and substracted from a current bit value generated to create a difference value. Only non-zero difference values need then be output for detection outside the array core to convey the full image information. This greatly reduces the number of bits outputed from the core. Similarly, signals generated by neighboring pixel elements 14 may be substracted, and only difference signals may then be output from the core to avoid outputting identical image information from a number of neighboring pixels. Data compression may also be performed outside of the core. The resulting compressed data must then be decompressed prior to filtering the data. Such compression may be required for reducing the output bandwidth of the sensor chip to communicate the digital image information over telephone lines.

Any size two dimensional array (e.g., 1000×1000) may be created using the concepts of this invention. Additionally, any suitable A/D converters 51 may be used, if such A/D converters 51 are small enough to be located within the array core 12.

While particular embodiments of the present invention have been shown and described, it will be obvious to those skilled in the art that changes in modifications may be made without departing from this invention in its broader aspects and, therefore, the appended claims are to encompass within their scope all such changes and modifications as fall within the true spirit and scope of this invention.

What is claimed is:

1. An image sensor circuit comprising:

a two dimensional array of photodetectors located within an image sensor core on an integrated circuit chip, each of said photodetectors having electrical characteristics which vary in response to light impinging upon said photodetectors; and a plurality of analog-to-digital (A/D) converters located within said two dimensional array of photodetectors within said image sensor core, each of said A/D converters being located in a separate pixel area containing one or more of said photodetectors, each of said converters being connected to said one or more of said photodetectors in said pixel area for converting an analog output of said one or more photodetectors to binary signals, an output of each pixel area in said image sensor core comprising said binary signals.

2. The circuit of claim 1 wherein each of said A/D converters comprises an A/D converter for converting said analog output of said one or more photodetectors to a string of binary bits to be output from said image sensor core.

3. The circuit of claim 2 further comprising a plurality of filters which receive strings of said binary bits output from said image sensor core and convert said strings of binary bits to digital values representative of a light intensity impinging upon respective photodetectors over a period of time.

4. The circuit of claim 1 wherein said A/D converters comprise Sigma-Delta modulators.

5. The circuit of claim 1 wherein all of said A/D converters are clocked simultaneously to simultaneously output binary signals from said image sensor core.

6. The circuit of claim 1 further comprising a row decoder, wherein said binary signals are output from said image sensor core by addressing rows of said A/D converters and causing an output of each A/D converter in an addressed row to be provided on a respective bit line in said image sensor core.

7. The circuit of claim 1 wherein each of said photodetectors is connected to a dedicated one of said A/D converters within said image sensor core.

8. The circuit of claim 1 wherein said array of photodetectors comprises an array greater than or equal to a 16×16 array.

9. The circuit of claim 1 wherein said array of photodetectors comprises an array greater than or equal to a 64×64 array.

10. The circuit of claim 1 further comprising:

a plurality of filters which receive strings of binary bits output from said A/D converters and convert said strings of binary bits to digital values representative of a light intensity impinging upon respective photodetectors over a period of time;

a memory for storing said digital values generated by said filters; and a control circuit for transferring said digital values from said filters to storage locations within said memory and for transferring said digital values from said memory to said filters for further processing by said filters as new data is being output from said image sensor core, said new data being processed by said filters to update said digital values which have been transferred from said memory to said filters, said control circuit then transferring updated digital values back to said memory.

11. The circuit of claim 1 further comprising data compression circuitry contained within said core for reducing a bandwidth of data output by each pixel area for detection outside of said core.

12. The circuit of claim 1 further comprising data compression circuitry contained outside of said core for reducing a bandwidth of data output from said integrated circuit chip.

13. A method for generating electrical signals representing an optical image, said method comprising the steps of:

generating an analog signal at each pixel location in a two dimensional array of photodetectors within an image sensor core, said analog signal corresponding to a light intensity impinging on said each pixel location;

converting said analog signal to digital signals at said each pixel location within said two dimensional array of photodetectors such that said each pixel location within said two dimensional array of photodetectors provides digital output signals representing a level of said analog signal; and processing said digital signals generated within said each pixel location to derive a single digital value associated with said each pixel location corresponding to said analog signal at said each pixel location over a period of time.

14. The method of claim 13 wherein said step of converting said analog signal to digital signals comprises converting said analog signal to a string of binary bits.

15. The method of claim 14 wherein said step of converting said analog signal comprises performing multiple one-bit analog-to-digital (A/D) conversions of said analog signal over a period of time.

16. The method of claim 15 wherein an A/D converter is located within said each pixel location, and wherein all A/D converters within said image sensor core are clocked using a single clock source.

17. The method of claim 16 wherein said each pixel location includes one or more photodetectors.

18. The method of claim 16 wherein said each pixel location includes one photodetector and one A/D converter.

* * * * *